US006989672B2

(12) United States Patent
Zhang

(10) Patent No.: US 6,989,672 B2
(45) Date of Patent: Jan. 24, 2006

(54) MEASUREMENT AND CORRECTION OF GRADIENT-INDUCED CROSS-TERM MAGNETIC FIELDS IN AN EPI SEQUENCE

(75) Inventor: Weiguo Zhang, Foster City, CA (US)

(73) Assignee: Toshiba America MRI, Inc., Tustin, CA (US)

( * ) Notice: Subject to any disclaimer, the term of this patent is extended or adjusted under 35 U.S.C. 154(b) by 0 days.

(21) Appl. No.: 10/960,669

(22) Filed: Oct. 8, 2004

(65) Prior Publication Data

US 2005/0040824 A1    Feb. 24, 2005

Related U.S. Application Data

(62) Division of application No. 10/348,009, filed on Jan. 22, 2003, now Pat. No. 6,836,113.

(51) Int. Cl.
*G01V 3/00* (2006.01)
(52) U.S. Cl. ...................... 324/307; 324/309
(58) Field of Classification Search ............. 324/309, 324/307, 312, 318, 319; 600/410, 409
See application file for complete search history.

(56) References Cited

U.S. PATENT DOCUMENTS

| | | | |
|---|---|---|---|
| 4,591,789 A | | 5/1986 | Glover et al. |
| 4,849,946 A | * | 7/1989 | Beauducel .................. 367/155 |
| 5,151,656 A | | 9/1992 | Maier et al. |
| 5,545,995 A | * | 8/1996 | Schneider et al. .......... 324/318 |
| 5,869,965 A | | 2/1999 | Du et al. |
| 6,043,651 A | | 3/2000 | Heid |
| 6,094,049 A | | 7/2000 | Rosenfeld et al. |
| 6,263,228 B1 | | 7/2001 | Zhang et al. |
| 6,329,821 B1 | | 12/2001 | Zhou |
| 6,512,372 B1 | | 1/2003 | Ikezaki |
| 6,836,113 B2 | * | 12/2004 | Zhang ........................ 324/307 |

OTHER PUBLICATIONS

"Concomitant Magnetic Field Gradients And Their Effects On Imaging At Low Magnetic Field Strengths", David G. Norris et al, *Magnetic Resonance Imaging*, vol. 8, pp. 33-37, 1990.
"NMR Imaging For Magnets With Large Nonuniformities", Kensuke Sekihara et al, pp. 193-199, 1985 IEEE.
"NMR Imaging In The Presence Of Magnetic Field Inhomogeneities And Gradient Field Nonlinearities", M. O'Donnell et al., pp. 20-26, 1985 Am. Assoc. Phys. Med.
"A Technique For Accurate Magnetic resonance Imaging In The Presence Of Field Inhomogeneities", Hsuan Chang et al., pp. 319-329, 1992 IEEE.
"Multi-Planar Image Formation Using NMR Spin Echoes", P. Mansfield, pp. L55-L58, J. Phys. C: Solid State Phys., vol. 10, 1977.
"Biological And Medial Imaging By NMR", P. Mansfield et al., pp. 355-373, Journal of Magnetic Resonance 29, (1978).

\* cited by examiner

*Primary Examiner*—Brij B. Shrivastav
(74) *Attorney, Agent, or Firm*—Nixon & Vanderhye P.C

(57) ABSTRACT

A method is disclosed for determining a gradient-induced cross-term magnetic field in a magnetic resonance imaging (MRI) system comprising: positioning an object in a static magnetic field; applying a radio frequency (RF) saturation pulse that spatially saturates nuclei of a slice of the object and applying an echo planar imaging (EPI) sequence to form an image of a slice of the object; generating a cross-field correction factor by analyzing the spatial distribution of the saturation line in the image.

10 Claims, 5 Drawing Sheets

MEASUREMENT AND CORRECTION OF GRADIENT-INDUCED CROSS-TERM MAGNETIC FIELDS IN AN EPI SEQUENCE

RELATED APPLICATIONS

This is a divisional application and claims priority under 35 U.S.C. §§120,121 to U.S. patent application Ser. No. 10/348,009 (now U.S. Pat. No. 6,836,113) filed Jan. 22, 2003, the entirety of which is incorporated by reference.

BACKGROUND OF THE INVENTION

The invention relates to magnetic resonance imaging (MRI), and in particular to high speed echo-planer imaging (EPI) techniques.

EPI is a commonly used MRI technique for high speed acquisition of NMR data, in which scan times are generally about 100 msec. For the simplicity of discussion, the Z-axis is used as the slice selection direction, the X-axis is used as the phase-encoding direction and the Y-axis is used as the readout direction. Other orientations may be applied when using the invention described herein.

As shown in FIGS. 1 and 2, in a conventional EPI pulse sequence, a 90° radio frequency (RF) excitation pulse 10 with a slice selective magnetic field gradient ($G_{slice}$) 12 is applied along an axis perpendicular to the imaging plane, e.g., ($G_z$), to excite the nuclei in the imaging plane of the body being imaged. A phase encoding gradient ($G_{phase}$) 14 and 24 is applied, along an axis ($G_x$) parallel to the imaging plane, after the excitation pulse to spatially encode the nuclei. Similarly, a phase shift gradient ($G_{read}$) 16 is applied, along an axis ($G_y$) parallel to the imaging plane and orthogonal to the phase encoding gradient, to center the subsequent scanning of the k-space (raw data space). A 180° RF rephasing pulse 18 is applied to generate a spin echo (SE) response (ADC) 20 from the excited nuclei. A slice specific gradient 19 may also be applied in conjunction with the 180° RF pulse.

During a signal sampling period, an alternating readout magnetic field gradient ($G_{read}$) 22 is applied to scan k-space and acquire SE signal samples 20 from the excited nuclei. In combination with the readout gradient, a continuous phase encoding gradient ($G_{phase}$) 24 may be applied to cause the scanning to move along the phase encoding ($G_x$) direction, as is shown in FIG. 3. The scan trajectory 26 forms a zig-zag pattern through k-space due to the alternating readout gradient 22 and the continuous phase encoding gradient 24. Alternatively, the phase encoding gradient may be applied as blip pulses 28 aligned with the reversal of the readout gradient to shift the scan trajectory 30 after each pass through a row of k-space, as is shown in FIG. 4.

As is shown in FIGS. 3 and 4, data is generally sampled during an EPI sequence in a raster scan trajectory through k-space, where individual scan lines corresponding to the readout gradient are sequentially sampled. After each scan line 32 is sampled, the k-space trajectory is shifted along the phase gradient direction to a next scan line 34. The reversal of the readout gradient 22 causes the k-space trajectory to reverse along the readout gradient. By reversing the trajectory, the scan through k-space can proceed back and forth along the read-out gradient on a line by line sequence.

The phase encoding gradients 24, 28 are perpendicular to the line by line trajectory of the data acquisition trajectory. Data along a line parallel to the phase encoding gradient is acquired slowly during the course of an entire scan of k-space. In contrast, data acquired along each line parallel to the readout gradient is acquired quickly as the scanning trajectory passes through one line of the scanning trajectory. Accordingly, data in the phase encoding gradient direction is acquired at a much slower rate than is data collected along the readout gradient direction.

The NMR signal samples acquired during the readout gradient may be transformed from the k-space domain to a spatial domain using conventional mathematical techniques, such as a Fourier transform. Data in the spatial domain is used to generate a NMR image of a cross-section of the body corresponding to the slice selected for imaging.

Images generated using an EPI sequence are susceptible to distortion and artifacts caused by magnetic field inhomogeneities and other abnormalities of the MRI system. With respect to high speed images generated using EPI sequences, the image distortions are particularly acute along the phase encoding direction because of the relatively slow data sampling rate along that direction.

Induced magnetic field distortions are a source of image distortions. An induced field distortion arises when a magnetic field is induced by a switched gradient magnetic field in an MR imaging sequence, an EPI sequence. The induced field is a cross-field when it is orthogonal to the inducing gradient field. Induced magnetic cross-field distortions may result from eddy-currents (EC) and Maxwell electromagnetic fields in the MRI system. During an EPI sequence, an induced cross-field may arise along the phase-encoding direction due to the rapidly switched readout gradient during the data sampling period.

In view of the relatively slow sampling rate along the phase-encoding direction ($G_{phase}$), the gradient induced cross-field due to a switched readout gradient ($G_{read}$) may result in substantial image distortions along the phase-encoding direction. The image distortion may be particularly acute in images generated from an EPI sequence where the readout gradient is repeatedly reversed during the data sampling period. There is a long-felt need for techniques to compensate for induced magnetic cross-fields that create image distortions, especially for distortions resulting from EPI sequences during which induced cross-fields are generated by the readout gradient.

BRIEF SUMMARY OF THE INVENTION

A technique has been developed for compensating for the distortions in the image data due to induced magnetic cross fields, and especially those generated by a switched readout gradient. The compensation technique allows for distortions in images due to induced cross-fields to be substantially reduced. The induced cross-field distortions are often acute along a direction corresponding to the phase-encoding gradient. The compensation technique is most helpful in reducing image distortion along the phase-encode direction.

In one embodiment, the invention is a method for determining a gradient-induced cross-term magnetic field in a magnetic resonance imaging (MRI) system comprising: positioning an object in a static magnetic field; applying a radio frequency (RF) saturation pulse that spatially saturates nuclei of a slice of the object, and applying an echo planar imaging (EPI) sequence to form an image of a slice of the object. The method may further include orienting the RF saturation slice between a readout direction and a phase-encoding direction of the EPI sequence. The RF saturation slice may appear as a dark saturation line in an image that is to be analyzed to yield a cross-field correction factor.

The compensation technique may further include initially measuring the induced magnetic cross-field, preferably by imaging a phantom object. The measurements of the induced cross-field effects in a phantom object are used to generate a cross-term correction factor. This factor is used to reduce image distortion and artifacts due to the cross-field induced during signal sampling of a patient's body.

DETAILED DESCRIPTION OF THE INVENTION

Figure 1:
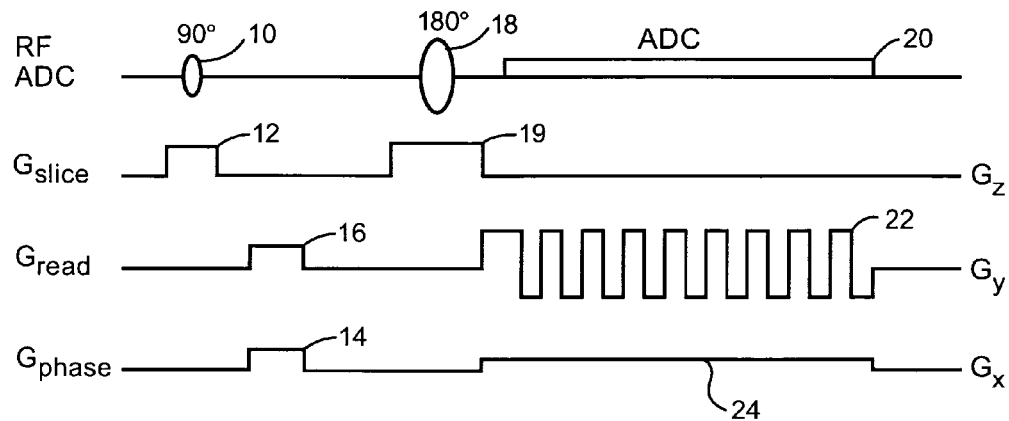
FIG. 1 is a sequence diagrams showing a conventional spin-echo two-dimensional (2D) EPI pulse sequence with a continuous phase-encoding gradient.
Figure 2:
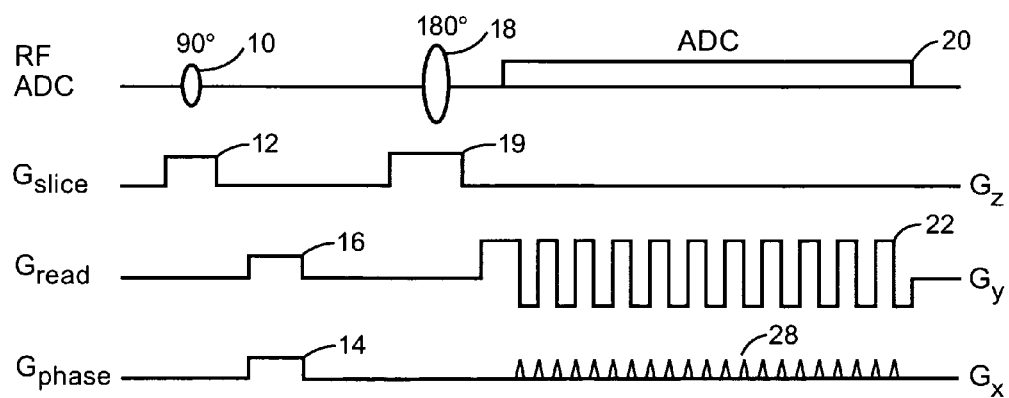
FIG. 2 is a sequence diagram showing a conventional spin-echo 2D EPI pulse sequence with blipped phase-encoding gradient pulses.
Figure 3:
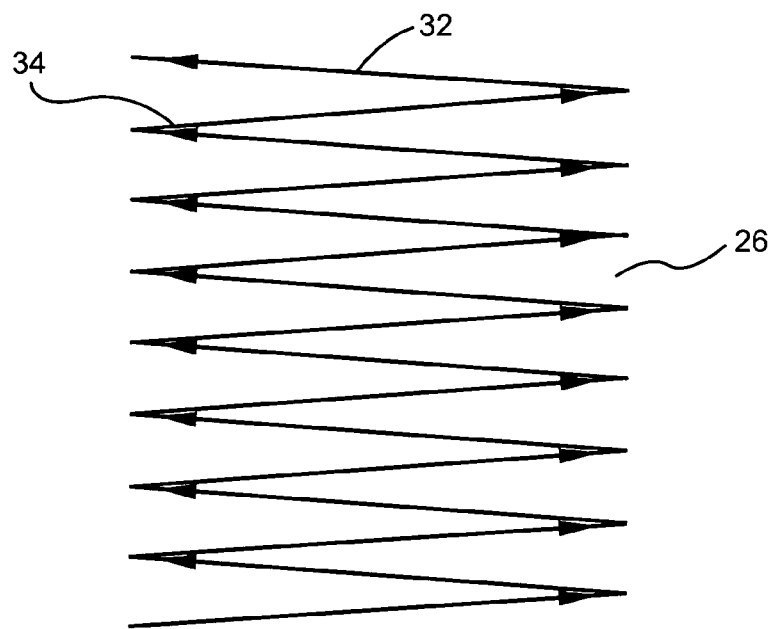
FIG. 3 is a chart showing the k-space trajectories sampled by the EPI sequence with a continuous phase-encoding gradient, as is diagramed in FIG. 1.
Figure 4:
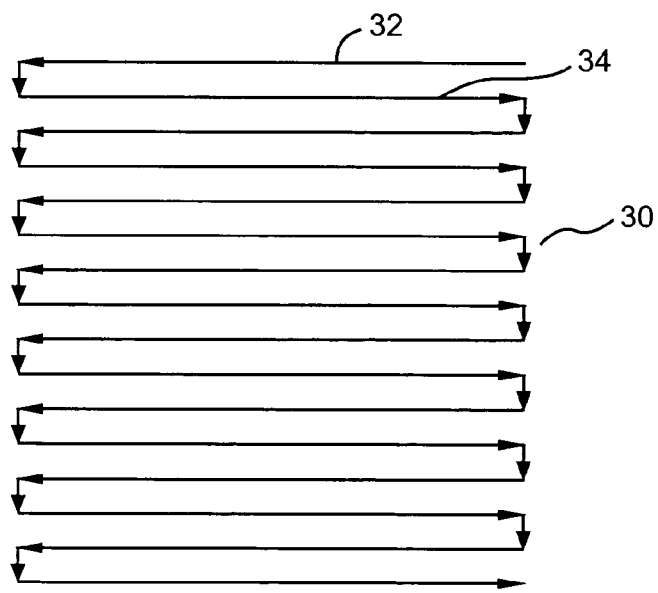
FIG. 4 is a chart showing the k-space trajectories sampled by the standard EPI sequence with blipped phase-encoding gradient, as is diagramed in FIG. 2.
Figure 5:
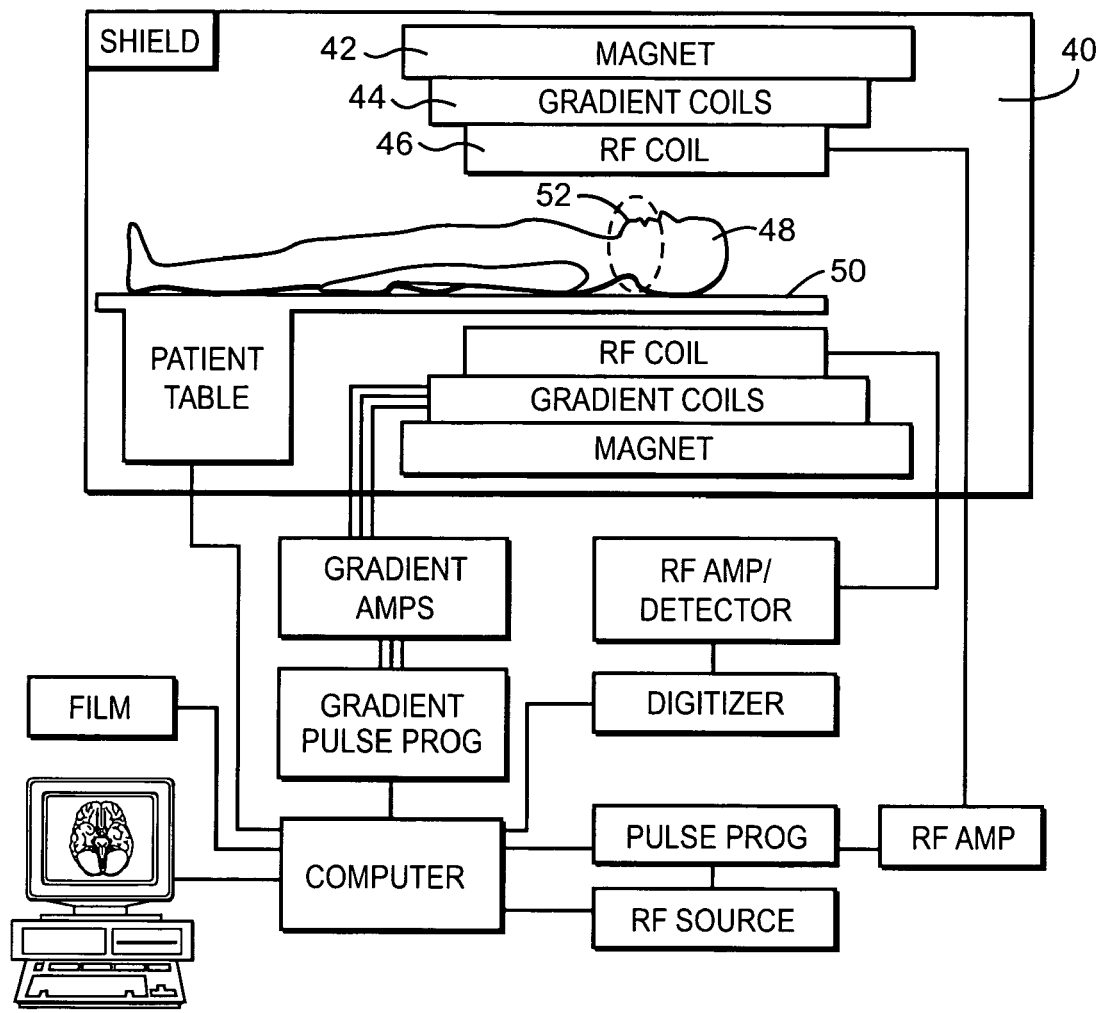
FIG. 5 is a schematic diagram of an MRI system.

As shown in FIG. 5, an MR imaging system 40 typically includes a magnet 42 to impose a static magnetic field ($B_0$), gradient coils 44 for imposing spatially distributed gradient magnetic fields ($G_x$, $G_y$, and $G_z$) having gradients along three respective orthogonal coordinates, and RF coils 46 to transmit and receive RF signals to and from the selected nuclei of the body being imaged. The patient 48 lies on a patient table 50 such that a portion of the patient to be imaged is in an "imaging volume" between the magnet and coils, which defines a field of view (FOV) of the MRI system.

The electromagnetic fields generated by the operation of the gradient coils 44 may induce cross-fields in the imaging volume. The magnitude of the induced cross-fields is dependent on the switching of gradient coils and the current in the coils. The induced cross-fields may be relatively large while gradient coils are rapidly switched, such as when the polarity of the readout gradient ($G_{read}$) is repeatedly reversed during a signal sampling period of an echo planar imaging (EPI) sequence. The induced cross-fields act on the phasing of the nuclei of the body in the imaging volume and thereby influence the NMR signals collected for MR imaging.

Figure 6:
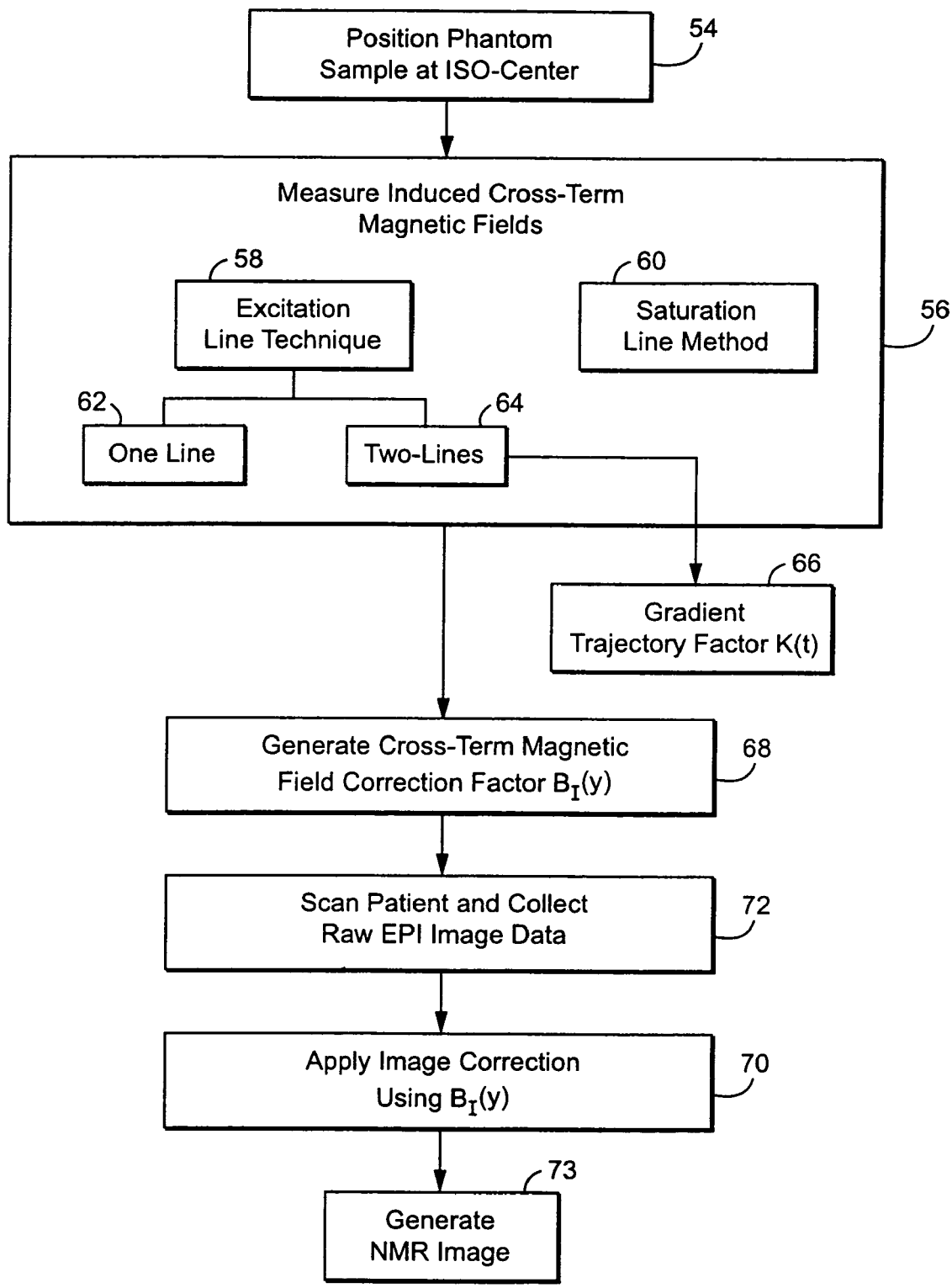
FIG. 6 is a flow diagram showing generally the steps in generating and applying a cross-term magnetic field correction factor.

FIG. 6 is a chart of a method for generating a cross-term field correction factor. The method corrects for induced cross-term magnetic fields, and particularly those caused by switched readout gradients. To isolate the effects on NMR signal data, a phantom sample is positioned at the iso-center 52 of the imaging volume, in step 54. The phantom sample may be a vessel filled with a hydrogen-rich fluid, such as baby oil. One example of a phantom sample is a 10 cm×10 cm×30 cm rectangular column vessel filled with baby-oil. The phantom object is imaged with the same EPI sequence as will be later used to image a patient. In particular, the phantom object may be imaged with an EPI sequence using the same readout gradient reversal rate and sampling period as is to be later used when imaging the patient.

The measurement of the cross-term may be made using an excitation line technique 58 or a saturation line technique 60. The excitation line technique 58 may be implemented as a one-line excitation 62 wherein only the cross-term is measured, or a two line excitation 64 wherein both the cross-term and the readout gradient trajectory timing are measured 66. The one and two-line excitation and the line saturation techniques each generate data from which a cross-term field correction factor ($B_f(Y)$) 68 is generated.

The correction factor ($B_f(y)$) is later applied to correct image data collected when scanning a patient. It is assumed that the induced cross-term that arises with the phantom sample is substantially the same as the induced cross-term that will arise when a patient is being imaged. The correction factor $B_f(y)$) generated using the phantom sample is applicable to correct for the cross-term in image data of a patient. Using a conventional image correction algorithm 70, the correction factor ($B_f(Y)$) 68 is used to correct the raw imaging data 72 collected from an EPI scan of a patient. The image generated 73 using the corrected raw image data should be largely free of artifacts due to the induced cross-term magnetic fields.

Figure 7:
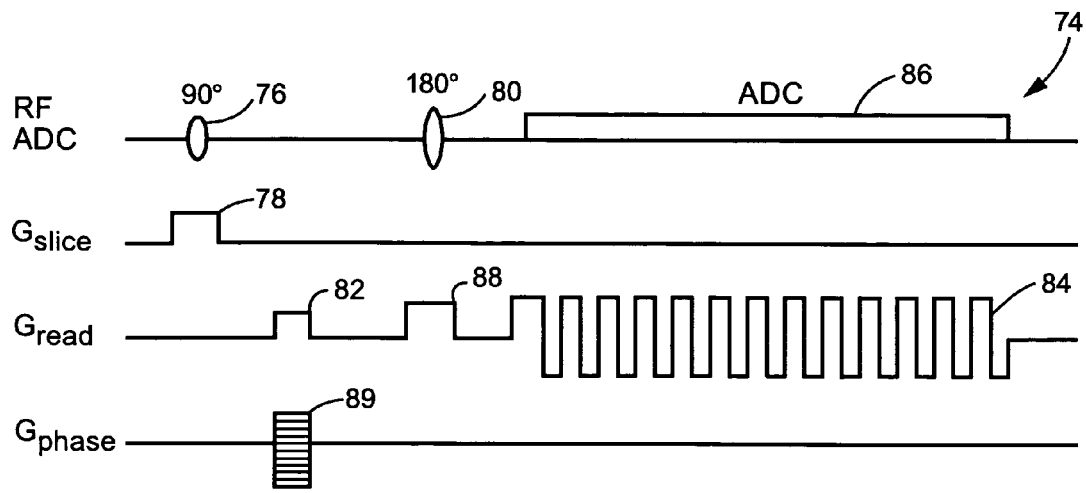
FIG. 7 is a sequence diagram showing a modified EPI pulse sequence for measuring cross-fields induced by the switched EPI readout gradient pulses.

FIG. 7 shows a modified spin-echo EPI sequence 74 for measuring cross-fields induced by a switched EPI readout gradient pulses. The modified sequence 74 includes: a 90° degree RF excitation pulse 76 spatially selective, with a slice selection gradient 78 pulse along the slice direction; a 180° degree RF refocusing pulse 80 spatially selective along the readout direction; an incremented phase-encoding gradient 89 applied between the 90° and 180° RF pulses, and a switched EPI readout gradient 84 alternating between positive and negative polarities is applied during the acquisition of the NMR signals (ADC) 86. The readout gradient pulses may be the same as in regular EPI imaging application of patients.

The modified EPI sequence 74 is used to acquire the NMR signal data used to determine the cross-fields induced by the EPI readout gradient pulses 84. A slice of the phantom object is selected by the spatially selective 90° pulse 76 in the presence of the slice gradient 78. Subsequently, a line from the slice is selected by the spatially selective 180° RF pulse 80 applied in the presence of a gradient 88 along the readout direction. Preferably, the selected line may be thick along the slice direction, e.g., about 1 cm (centimeters), and thin along the readout direction, e.g., in a range of about 2 to 3 mm (millimeters). The selected straight line is phase encoded with an incremented phase-encoding gradient pulse 89 along the direction of the line. The phase encoding spatially encodes the selected line.

The NMR signals acquired from the selected line evidence the effects of the cross-fields induced by the EPI switched readout gradients. Since a straight line is selected and a phantom sample is being imaged, the variations of the NMR frequency along the line are attributable to the cross-fields induced by the switched EPI readout gradient pulses.

The excitation line method 58 may be used to measure the induced magnetic cross-fields only, or both the cross-fields and the EPI readout gradient trajectories. To measure only the induced magnetic cross-fields, a single line is selected that passes through the iso-center of the MRI system. The line(s) is selected along the direction, e.g. $G_{phase}$, for which the cross-fields are to be measured and the readout is along the direction of the inducing gradient pulses, e.g., $G_{read}$.

The measurement yields a data array represented by $S(k_m, t_n)$, where $m=1, 2, \ldots, M$, and $n=1, 2, \ldots, N$. In this data array, $k_m$ is the phase-encoding gradient k-value; $t_n$ represents the time when the data point is acquired within the EPI readout window, and M and N are the number of data points acquired along the phase-encoding and readout dimensions, respectively. The data array $S(k_m, t_n)$ contains the information of the distortion of NMR signals due to the cross-magnetic fields induced by a gradient field, such as a switched EPI readout gradient.

If both the trajectory of the EPI readout gradient and the cross-fields induced by the readout gradient are to be measured, then two parallel lines 64 are selected for acquisition of twin data arrays. The lines are equally offset but in opposite directions from the iso-center along the readout direction by +L and −L, respectively. The lines are parallel to the direction of the cross-term, e.g. $G_{phase}$. The measurement of the NRM data along the two selected lines yields two data arrays, $S^{+L}(k_m, t_n)$ and $S^{-L}(k_m, t_n)$, with each array corresponding to one of the selected lines.

The acquired data from each line are first one-dimensional (1D) Fourier transformed (FT) along the phase-encoding direction, and then subjected to further processing steps for measuring the EPI readout gradient trajectory and the cross-fields induced by the EPI readout gradient.

For measurement of the EPI readout gradient trajectory, after the 1D FT along the phase-encoding direction, the instantaneous frequency $f(Y_m, t_n)$ corresponding to position $Y_m$ and time $t_n$ is determined from the signal phases in accordance with equation 1 below:

$$f(Y_m, t_n) = \frac{\arg\{S(Y_m, t_n) \cdot S^*(Y_m, t_{n-1})\}}{t_n - t_{n-1}} \quad [1]$$

where $S^*(Y_m, t_{n-1})$ is the conjugate of $S(Y_m, t_{n-1})$, and $\arg\{\}$ returns the principal phase value of its complex input.

The gradient trajectory is determined from the instantaneous frequencies according to equation 2:

$$k(t_n) = \frac{1}{M} \sum_{m=1}^{N} \frac{f^{+L}(Y_m, t_n) - f^{-L}(Y_m, t_n)}{2L} \quad [2]$$

where $f(Y_m, t_n)$ is the instantaneous frequency at position $Y_m$ and time $t_n$ when each data point is acquired along a selected line, and L (+ and −) are the offsets of the selected line from the iso-center.

To determine the cross-fields induced by the EPI readout gradient, a reduced array of data representative of the cross-field is extracted from the measured data array as shown in equation 3:

$$S(Y_m, t_p) \in S(Y_m, t_n) \quad [3]$$

where $t_p$ represents the time when the corresponding point in the reduced data array is acquired.

The sub-array $S(Y_m, t_p)$ is extracted by taking the center point from each EPI echo. If both even and odd echoes are used in producing EPI images, the sub-array may consist of data representative of the echo center points of the complete EPI echo train.

The instantaneous frequency ($f(Y_m, t_p)$) is again calculated according to equation [1], but using the reduced array instead as represented by equation 4:

$$f(Y_m, t_p) = \frac{\arg\{S(Y_m, t_p) \cdot S^*(Y_m, t_{p-1})\}}{t_p - t_{p-1}} \quad [4]$$

In the case of a single-line measurement 62, the instantaneous frequency, after 1D FT of $f(Y_m, t_p)$ to yield $CF(Y_m)$, may be directly used and fitted to a polynomial function of $Y_m$ using algorithms such as the least square minimization. The polynomial function from the fitting represents the center frequency distribution, $CF(Y_m)$ along the selected line, which is in the direction of measurement for cross-field distribution. The center frequency distribution is related to the induced cross-field by $\gamma B_1(Y_m) = CF(Y_m)$, where $B_1$ stands for the induced cross-field.

In the case of the double-line measurement 64, when the gradient trajectory is also to be measured, the addition of the instantaneous frequencies from the two symmetrically shifted lines are used and fitted to a polynomial function of $Y_m$, again after 1D FT of $f^+(Y_m, t_p)$ to yield $CF(Y_m)$, to determine a center frequency distribution ($CF(Y_m)$) using equation 5, as follows:

$$f^+(Y_m, t_p) = \frac{f^L(Y_m, t_p) + f^{-L}(Y_m, t_p)}{2} \quad [5]$$

Figure 8:
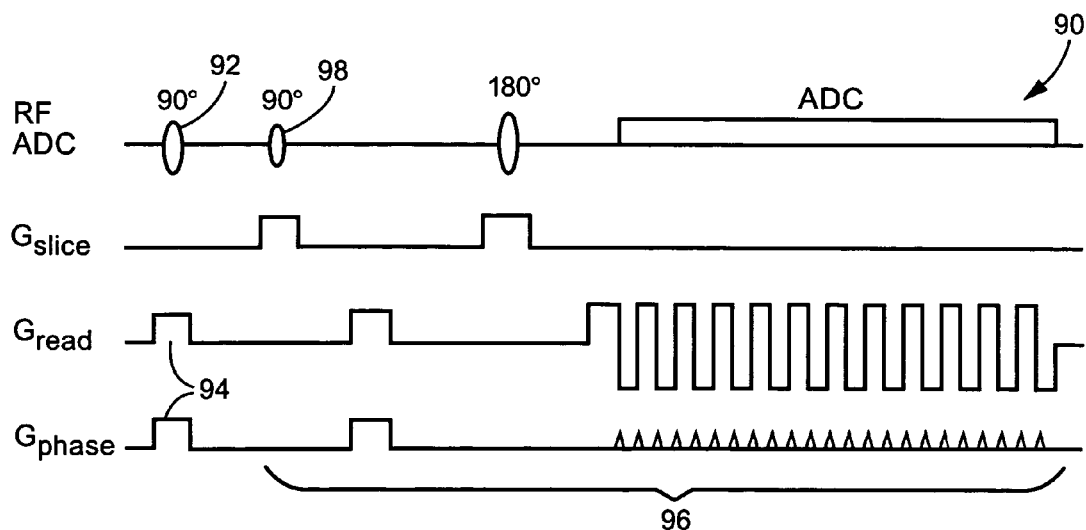
FIG. 8 is a sequence diagram showing another modified EPI pulse sequence for measuring cross-fields induced by the switched EPI readout gradient pulses.

FIG. 8 shows another modified spin-echo EPI sequence 90 for measuring cross-fields induced by the switched EPI readout gradient pulses. The sequence includes a 90° o RF excitation pulse 92 and gradient 94 that are spatially selective along both the phase-encoding direction and readout direction for selectively saturating a slice of spins angled in-between the phase-encoding direction and readout direction. After the first 90° RF pulse 92, a standard spin-echo EPI sequence 96 is applied, which includes another 90° RF pulse 98. The spatial distribution of the saturated slice, which shows as a dark line in the acquired 2D EPI image, is indicative of the induced cross-fields. The phase-encoding position displacement $\Delta X_m$ as a function of the phase encoding position $\Delta X_m(X_m)$ may be fitted to a polynomial function for quantifying the cross-fields.

The procedures for data acquisition and processing may be repeated for various line orientations and with as many variations of EPI readout gradient waveforms as are needed to model the induced magnetic cross-fields for the operating modes used by the MRI system to image patients. These procedures may be part of a system calibration package that is applied to characterize an MRI scanner. The results of these procedures may be stored as part of the system specification parameters. The results of these procedures may be applied to correct images, or make system adjustments necessary to reduce image distortion or artifacts caused by the cross-fields.

The cross-fields induced by the EPI readout gradient are manifested into image distortions along the phase-encoding direction the same way as do static field inhomogeneities. Accordingly, the results from cross-field measurement are used for image correction by applying the same algorithm as for $B_0$ inhomogeneity correction. Examples of $B_o$ inhomogeneity correction algorithms are set forth in: Chang, H., and Fitzpatrick, J. M., "A Technique for Accurate Magnetic Resonance Imaging in the Presence of Field Inhomogeneities", IEEE Transactions on Medical Imaging 11:319–329, 1992; O'Donnell M., and Edelstein, W. A., "NMR Imaging in the Presence of Magnetic Field Inhomogeneities and Gradient Field Nonlinearities", Med. Phys. 12:20–26, 1985; Sekihara, K., Matsui, S., and Kohno, H., "NMR Imaging for Magnets with Large Nonuniformities", IEEE Transactions on Medical Imaging MI-4:193–199, 1985. The inhomogeneity correction procedures may be applied with cross-term corrections for reducing EPI image distortion.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for determining a gradient-induced cross-term magnetic field in a magnetic resonance imaging (MRI) system comprising:
   a. positioning an object in a static magnetic field;
   b. applying a radio frequency (RF) saturation pulse that spatially saturates nuclei of a slice of the object, and
   c. after step (b), applying an echo planar imaging (EPI) sequence to form an image of a slice of the object.

2. A method as in claim 1 wherein the RF saturation pulse is applied in presence of a gradient field such that the saturation slice is oriented between a readout direction and a phase-encoding direction of the EPI sequence.

3. A method as in claim 1 wherein the saturation slice appears as a dark saturation line in the image, and the method further comprises analyzing a spatial distribution of the saturation line to yield a cross-field correction factor.

4. A method as claim 1 further comprising:
   d. generating a cross-field correction factor by measuring and analyzing the spatial distribution of a saturation line in the image of the slice of the object, and
   e. applying the cross-field correction factor to correct another image of a second object and thereby reduce image distortion due to a cross-term magnetic field induced by the EPI readout gradient pulse.

5. A method as in claim 1 further comprising repeating at least steps (b) and (c) at a plurality of directions of the EPI readout gradient pulse.

6. A method as in claim 1 further comprising repeating at least steps (b) and (c) for all trajectories of the EPI readout gradient pulse.

7. A method as in claim 4 wherein the cross-field factor includes a term for $B_0$ shift.

8. A method as in claim 1 wherein the object is aligned with an iso-center of the readout gradient field.

9. A method as in claim 1 wherein the object is a phantom sample vessel containing a hydrogen rich fluid.

10. A method as in claim 1 performed while calibrating the MRI system.

* * * * *